United States Patent
Chung et al.

(10) Patent No.: US 8,401,503 B2
(45) Date of Patent: Mar. 19, 2013

(54) DUAL-LOOP AUTOMATIC FREQUENCY CONTROL FOR WIRELESS COMMUNICATION

(75) Inventors: Seong Taek Chung, Redwood City, CA (US); Vinay Murthy, San Diego, CA (US); Alok Kumar Gupta, Encinitas, CA (US); Fuyun Ling, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 1525 days.

(21) Appl. No.: 11/358,996

(22) Filed: Feb. 21, 2006

(65) Prior Publication Data
US 2006/0203950 A1 Sep. 14, 2006

Related U.S. Application Data

(60) Provisional application No. 60/657,839, filed on Mar. 1, 2005, provisional application No. 60/660,914, filed on Mar. 11, 2005.

(51) Int. Cl.
*H04B 1/18* (2006.01)
(52) U.S. Cl. .......... 455/182.2; 455/553.1; 455/136; 455/259
(58) Field of Classification Search .......... 455/552.1, 455/553.1, 136, 141, 164.1, 164.2, 182.1, 455/182.2, 183.2, 184.1, 186.1, 192.1, 196.2, 455/132, 196.1, 197.1, 257, 258, 259
See application file for complete search history.

(56) References Cited

U.S. PATENT DOCUMENTS

| | | | |
|---|---|---|---|
| 4,438,511 A | 3/1984 | Baran | |
| 4,715,001 A * | 12/1987 | Deem et al. ................. | 702/75 |
| 5,151,926 A | 9/1992 | Chennakeshu et al. | |
| 5,504,453 A | 4/1996 | MacDonald et al. | |
| 5,692,016 A | 11/1997 | Vanselow | |
| 5,940,450 A | 8/1999 | Koslov et al. | |
| 6,064,270 A | 5/2000 | Douglas ................. | 331/1 R |
| 6,163,710 A * | 12/2000 | Blaser et al. ................. | 455/552.1 |
| 6,226,505 B1 | 5/2001 | Uda | |
| 6,424,826 B1 * | 7/2002 | Horton et al. ................. | 455/255 |

(Continued)

FOREIGN PATENT DOCUMENTS

| | | |
|---|---|---|
| EP | 0729250 A2 | 8/1996 |
| EP | 0 844 764 A2 | 5/1998 |

(Continued)

OTHER PUBLICATIONS

International Search Report and Written Opinion—PCT/US2006/007453, International Search Authority, European Patent Office—Jun. 22, 2006.

*Primary Examiner* — Christian Hannon
(74) *Attorney, Agent, or Firm* — Fulbright & Jaworski L.L.P.

(57) ABSTRACT

Techniques for performing frequency control using dual-loop automatic frequency control (AFC) are described. The dual-loop AFC includes an inner loop that corrects short-term frequency variations (e.g., due to Doppler effect) and an outer loop that corrects long-term frequency variations (e.g., due to component tolerances and temperature variations). In one design, a first inner loop is implemented for frequency control of a first system (e.g., a broadcast system), a second inner loop is implemented for frequency control of a second system (e.g., a cellular system), and at least one outer loop is implemented for adjusting a reference frequency used to receive signals from the first and second systems. Each inner loop estimates and corrects the frequency error in an input signal for the associated system and may be enabled when receiving the input signal from the system. The reference frequency may be used for frequency downconversion, sampling and/or other purposes.

40 Claims, 10 Drawing Sheets

U.S. PATENT DOCUMENTS

| | | |
|---|---|---|
| 6,463,266 B1 | 10/2002 | Shohara ................. 455/196.1 |
| 6,470,367 B1 | 10/2002 | Yeh et al. |
| 6,522,696 B1 | 2/2003 | Mobin et al. .................. 375/262 |
| 6,760,573 B2 * | 7/2004 | Subrahmanya et al. ... 455/192.2 |
| 6,847,688 B1 | 1/2005 | Molnar et al. ................ 375/344 |
| 6,879,274 B2 | 4/2005 | Nestler et al. |
| 6,882,691 B2 | 4/2005 | Chiodini |
| 7,062,240 B2 * | 6/2006 | Ballantyne et al. ........ 455/182.1 |
| 7,133,646 B1 * | 11/2006 | Miao .............................. 455/73 |
| 7,239,675 B2 | 7/2007 | Zehavi et al. |
| 7,289,765 B2 | 10/2007 | Okada et al. |
| 7,386,058 B2 | 6/2008 | Fujii |
| 7,443,826 B1 * | 10/2008 | Atarius et al. ................ 370/342 |
| 7,444,240 B2 * | 10/2008 | Macneille et al. ........... 701/300 |
| 8,009,775 B2 | 8/2011 | Murthy et al. |
| 2003/0043768 A1 | 3/2003 | Chang et al. |
| 2003/0053550 A1 | 3/2003 | Peyla et al. |
| 2003/0068977 A1 * | 4/2003 | King .............................. 455/12.1 |
| 2003/0114110 A1 | 6/2003 | Dahlback et al. ............ 455/67.1 |
| 2004/0005018 A1 | 1/2004 | Zhu et al. |
| 2004/0005022 A1 | 1/2004 | Zhu et al. |
| 2004/0132421 A1 * | 7/2004 | Underbrink .................. 455/255 |
| 2004/0142701 A1 | 7/2004 | Abraham .................. 455/456.1 |
| 2004/0170238 A1 | 9/2004 | Matsuyama et al. |
| 2004/0228272 A1 | 11/2004 | Hasegawa et al. |
| 2005/0025264 A1 | 2/2005 | Chen |
| 2005/0212697 A1 * | 9/2005 | Brabec et al. ............ 342/357.04 |
| 2006/0140109 A1 | 6/2006 | Lin |
| 2007/0036231 A1 | 2/2007 | Ido |
| 2007/0147336 A1 | 6/2007 | Lee et al. |

FOREIGN PATENT DOCUMENTS

| | | |
|---|---|---|
| EP | 0847169 A2 | 6/1998 |
| EP | 0 959 568 A1 | 11/1999 |
| EP | 0999676 A2 | 5/2000 |
| EP | 1480363 A1 | 11/2004 |
| JP | 2000165341 | 6/2000 |
| JP | 2004007280 | 1/2004 |
| JP | 2006507753 | 3/2006 |
| WF | 0940909 A1 | 9/1999 |
| WO | WO9216063 A1 | 9/1992 |
| WO | WO0033496 A1 | 6/2000 |
| WO | WO03032542 A1 | 4/2003 |
| WO | WO03047118 | 6/2003 |
| WO | WO03069865 | 8/2003 |
| WO | WO2004006460 | 1/2004 |

* cited by examiner

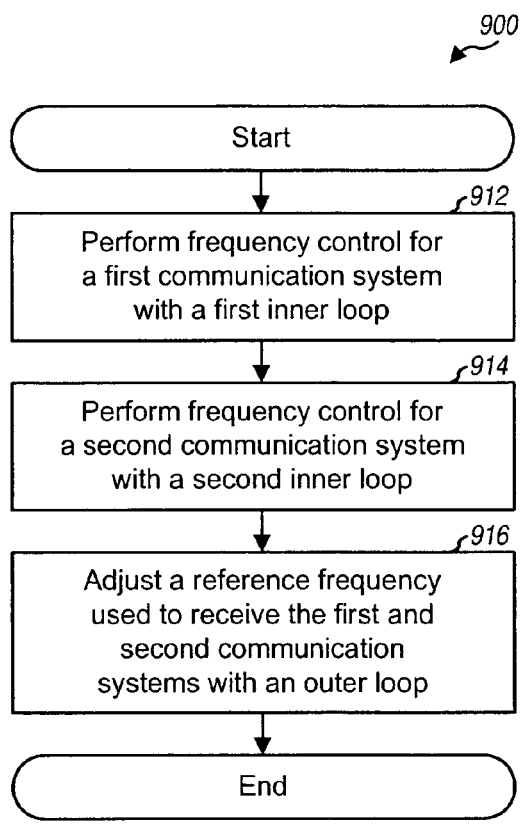
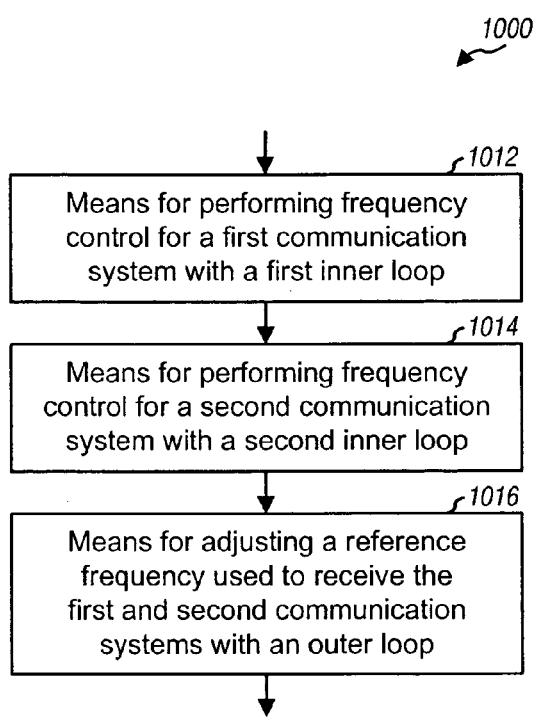
FIG. 9
FIG. 10

DUAL-LOOP AUTOMATIC FREQUENCY CONTROL FOR WIRELESS COMMUNICATION

The present application claims priority to provisional U.S. Application Ser. No. 60/657,839, entitled "Method and Apparatus for Dual-Loop Automatic Frequency Control," filed Mar. 1, 2005, and U.S. application Ser. No. 60/660,914, entitled "Automatic Frequency Controller," filed Mar. 11, 2005, both assigned to the assignee hereof and incorporated herein by reference.

BACKGROUND

I. Field

The present disclosure relates generally to communication, and more specifically to automatic frequency control (AFC) for wireless communication.

II. Background

In wireless communication, a transmitter modulates data onto a radio frequency (RF) carrier signal to generate an RF modulated signal that is more suitable for transmission. The transmitter then transmits the RF modulated signal via a wireless channel to a receiver. The transmitted signal may reach the receiver via one or more propagation paths, which may include a line-of-sight path and/or reflected paths. The characteristics of the wireless channel may vary over time due to various phenomena such as fading and multipath. Consequently, the transmitted signal may experience different channel conditions and may be received with different amplitudes and/or phases over time.

The receiver receives the transmitted signal, downconverts the received signal with a local oscillator (LO) signal, and processes the downconverted signal to recover the data sent by the transmitter. The receiver typically performs frequency control (e.g., frequency acquisition and tracking) to estimate the frequency error in the LO signal and to correct this frequency error. This frequency error may be due to various factors such as receiver circuit component tolerances, temperature variations, and Doppler effect due to movement by the receiver and/or transmitter. The frequency control may be challenging if the requirements on frequency accuracy are stringent. The frequency control may also be complicated if the receiver intermittently receives data from the transmitter.

There is therefore a need in the art for techniques to expeditiously and reliably perform frequency control for wireless communication.

SUMMARY

Techniques for performing frequency control using dual-loop AFC are described herein. The dual-loop AFC includes an inner loop that corrects short-term frequency variations (e.g., due to Doppler effect) and an outer loop that corrects long-term frequency variations (e.g., due to component tolerances and temperature variations). These techniques may be used for frequency control when receiving one or multiple communication systems, e.g., a broadcast system, a cellular system and/or a satellite positioning system. These techniques may also be used for frequency control when receiving a bursty transmission.

In an aspect, the dual-loop AFC is used for frequency control of multiple systems. In an embodiment, a first inner loop is implemented for frequency control of a first system (e.g., a broadcast system), a second inner loop is implemented for frequency control of a second system (e.g., a cellular system), and at least one outer loop is implemented for adjusting a reference frequency used to receive the first and second systems. The reference frequency may be generated by a reference oscillator (e.g., a TC-VCXO) and may be used for frequency downconversion, sampling and/or other purposes. The first inner loop estimates and corrects the frequency error in a first input signal for the first system. The second inner loop estimates and corrects the frequency error in a second input signal for the second system. The first and second inner loops may be enabled when receiving the first and second systems, respectively. Separate first and second outer loops may be implemented for the first and second systems, respectively, and one outer loop may be selected to update the reference frequency. Alternatively, a single outer loop may be implemented for both systems and may be updated with first and/or second inner loop. Exemplary designs of the inner and outer loops are described below.

In another aspect, the dual-loop AFC is used for frequency control of a bursty transmission in which data is received in bursts. In an embodiment, an AFC inner loop is updated in each inner loop update instant during each burst of data, and an AFC outer loop is updated in each outer loop update instant. The inner loop estimates and corrects the frequency error in the bursts of data. The outer loop estimates and corrects the frequency error in a reference frequency used to receive the bursts of data. The inner loop may be updated, e.g., with each OFDM symbol received during a burst of data. The outer loop may be updated, e.g., at the end of each burst of data.

Various aspects and embodiments of the invention are described in further detail below.

BRIEF DESCRIPTION OF THE DRAWINGS

The features and nature of the present invention will become more apparent from the detailed description set forth below when taken in conjunction with the drawings in which like reference characters identify correspondingly throughout.

FIG. 9 shows a process to perform frequency control for multiple systems.

FIG. 10 shows an apparatus to perform frequency control for multiple systems.

DETAILED DESCRIPTION

The word "exemplary" is used herein to mean "serving as an example, instance, or illustration." Any embodiment or design described herein as "exemplary" is not necessarily to be construed as preferred or advantageous over other embodiments or designs.

Figure 1:
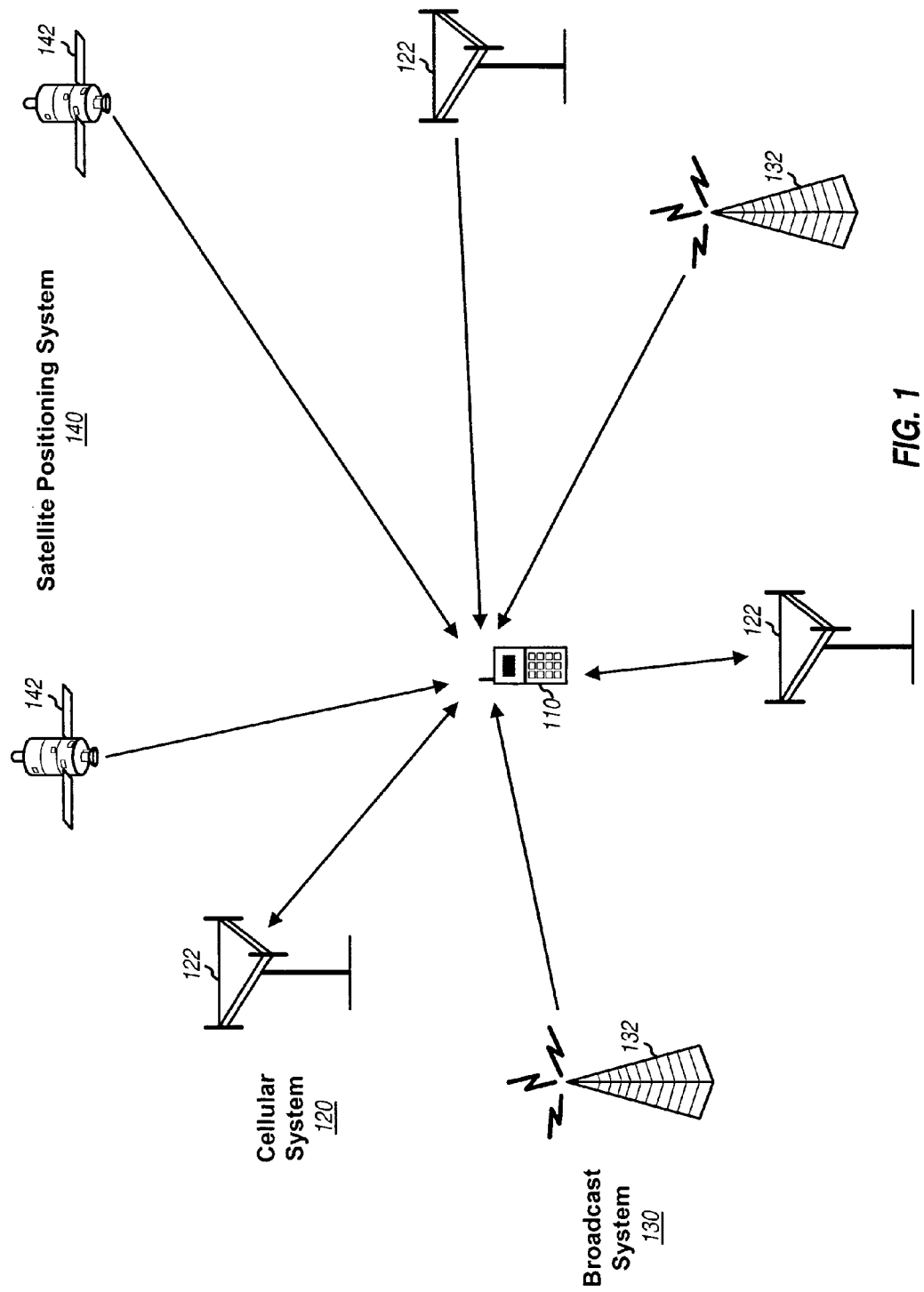
FIG. 1 shows a terminal communicating with multiple systems.

FIG. 1 shows a terminal 110 capable of communicating with multiple communication systems. These systems may include a cellular system 120, a broadcast system 130, a satellite positioning system 140, a wireless local area network (WLAN) system (not shown in FIG. 1), other systems, or any combination thereof.

Cellular system 120 may be a Code Division Multiple Access (CDMA) system, a Time Division Multiple Access (TDMA) system, a Frequency Division Multiple Access (FDMA) system, an Orthogonal Frequency Division Multiple Access (OFDMA) system, a Single-Carrier FDMA (SC-FDMA) system, or some other cellular system. A CDMA system may utilize a radio technology such as cdma2000, Wideband-CDMA (W-CDMA), and so on. cdma2000 covers IS-95, IS-2000 and IS-856 standards. A TDMA system may utilize a radio technology such as Global System for Mobile Communications (GSM), Digital Advanced Mobile Phone System (D-AMPS), and so on. D-AMPS covers IS-136 and IS-54 standards. These various systems, radio technologies, and standards are known in the art. Cellular system 120 may be a Universal Mobile Telecommunication System (UMTS) that implements W-CDMA, a CDMA2000 1× system that implements IS-2000 and/or IS-95, a CDMA2000 1xEV-DO system that implements IS-856, a GSM system, or some other system.

Broadcast system 130 may be a MediaFLO system, a Digital Video Broadcasting for Handhelds (DVB-H) system, an Integrated Services Digital Broadcasting for Terrestrial Television Broadcasting (ISDB-T) system, or some other broadcast system. These broadcast systems are known in the art.

Satellite positioning system 140 may be the United States Global Positioning System (GPS), the Russian Glonass system, the European Galileo system, or some other satellite positioning system. GPS is a constellation of 24 well-spaced satellites plus some spare satellites that orbit the earth. Each GPS satellite transmits an encoded signal that allows receivers on earth to accurately estimate their positions based on measurements for a sufficient number of satellites (typically four) and the known locations of these satellites.

As shown in FIG. 1, cellular system 120 includes a number of base stations 122 that support communication for the terminals within their coverage. A base station is typically a fixed station used for communicating with the terminals and may also be called a base transceiver subsystem (BTS), a Node B, an access point, and so on. Broadcast system 130 includes a number of broadcast stations 132 that broadcast data to the terminals within their coverage. Base stations 122 and broadcast stations 132 may be located at different sites (as shown in FIG. 1) or co-located at the same site (not shown in FIG. 1). Satellite positioning system 140 includes a number of satellites 142 that transmit signals used for position determination.

Terminal 110 may be fixed or mobile and may also be called a mobile station, a user equipment, a mobile equipment, and so on. Terminal 110 may be a cellular phone, a personal digital assistant (PDA), a wireless modem, a wireless communication device, a handheld device, a subscriber unit, and so on. For clarity, much of the following description is for an embodiment in which terminal 110 is capable of communicating with a CDMA system (which may be a UMTS system or a CDMA 1× system), the MediaFLO system, and GPS.

Figure 2:
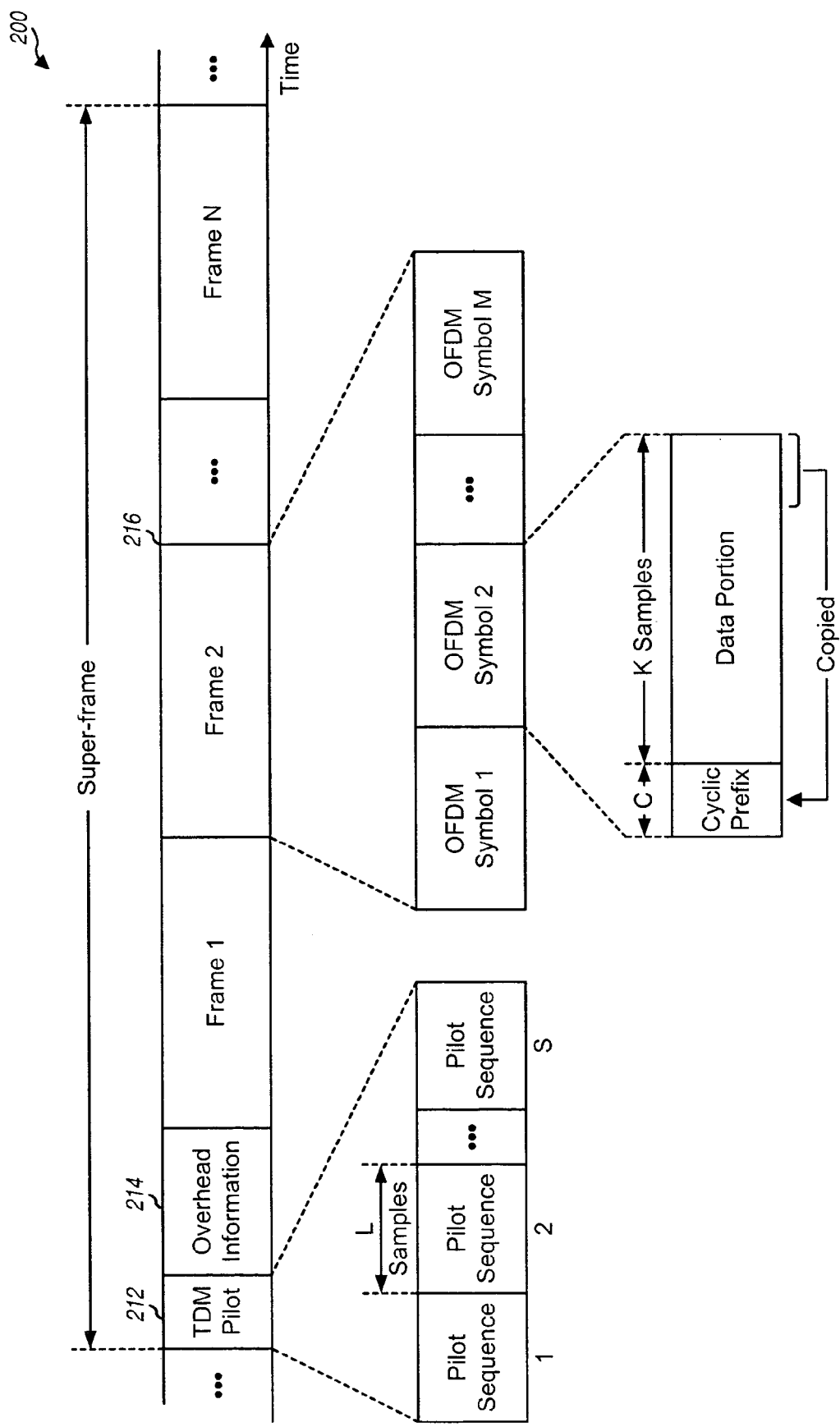
FIG. 2 shows an exemplary super-frame structure.

FIG. 2 shows an exemplary super-frame structure 200 that may be used for broadcast system 130. In the embodiment shown in FIG. 2, the transmission timeline is partitioned into super-frames, with each super-frame having a particular time duration, e.g., approximately one second. Each super-frame includes a field 212 for a time division multiplexed (TDM) pilot, a field 214 for overhead/control information, and a field 216 with N frames for traffic data, where N≧1. A super-frame may also include different and/or additional fields not shown in FIG. 2.

In the embodiment shown in FIG. 2, the TDM pilot is composed of S identical pilot sequences, with each pilot sequence containing L time-domain samples, where S>1 and L>1. The TDM pilot may be generated by (1) performing an L-point inverse fast Fourier transform (IFFT) on L modulation symbols to obtain a pilot sequence with L time-domain samples and (2) repeating the pilot sequence S times. The TDM pilot may be used for signal detection, frame synchronization, initial frequency error estimation, coarse time synchronization and/or other purposes.

The overhead information may convey the identity of a broadcast station transmitting the overhead information, where and how data channels are sent in the frames of a super-frame, and/or other information. The data channels are sent in the N frames and at frequency and time locations indicated by the overhead information. Each data channel may carry any type of data such as video, audio, tele-text, data, video/audio clips, and so on. Terminal 110 may be interested in receiving one or more specific data channels from broadcast system 130. Terminal 110 may ascertain where each desired data channel is sent, e.g., based on the overhead information and/or the data sent on the data channel. Terminal 110 may go to sleep much of the time to conserve battery power and may wake up periodically to receive the desired data channel(s).

In the embodiment shown in FIG. 2, data is transmitted using Orthogonal Frequency Division Multiplexing (OFDM). OFDM partitions the system bandwidth into multiple (K) orthogonal subcarriers, which are also called tones, bins, and so on. Each subcarrier may be modulated with data. Each frame carries multiple (M) OFDM symbols. An OFDM symbol may be generated by (1) performing a K-point IFFT on K modulation symbols to obtain K time-domain samples for a data portion of the OFDM symbol and (2) copying the last C samples of the data portion to form a cyclic prefix for the OFDM symbol. The data portion is also referred to as a useful portion, a transformed symbol, and so on. Windowing/filtering may also be performed on the cyclic prefix and the data portion. An OFDM symbol may contain K+C samples without windowing or possibly more than K+C samples with windowing.

In an embodiment, K=4096, C=512, and each OFDM symbol contains 4608 time-domain samples prior to windowing. In an embodiment, L=128, S=36, and the TDM pilot contains 36 identical pilot sequences of length 128. Other values may also be used for K, C, L and S.

FIG. 2 shows a specific super-frame structure. The frequency control techniques described herein may also be used for other frame and super-frame structures.

Figure 3:
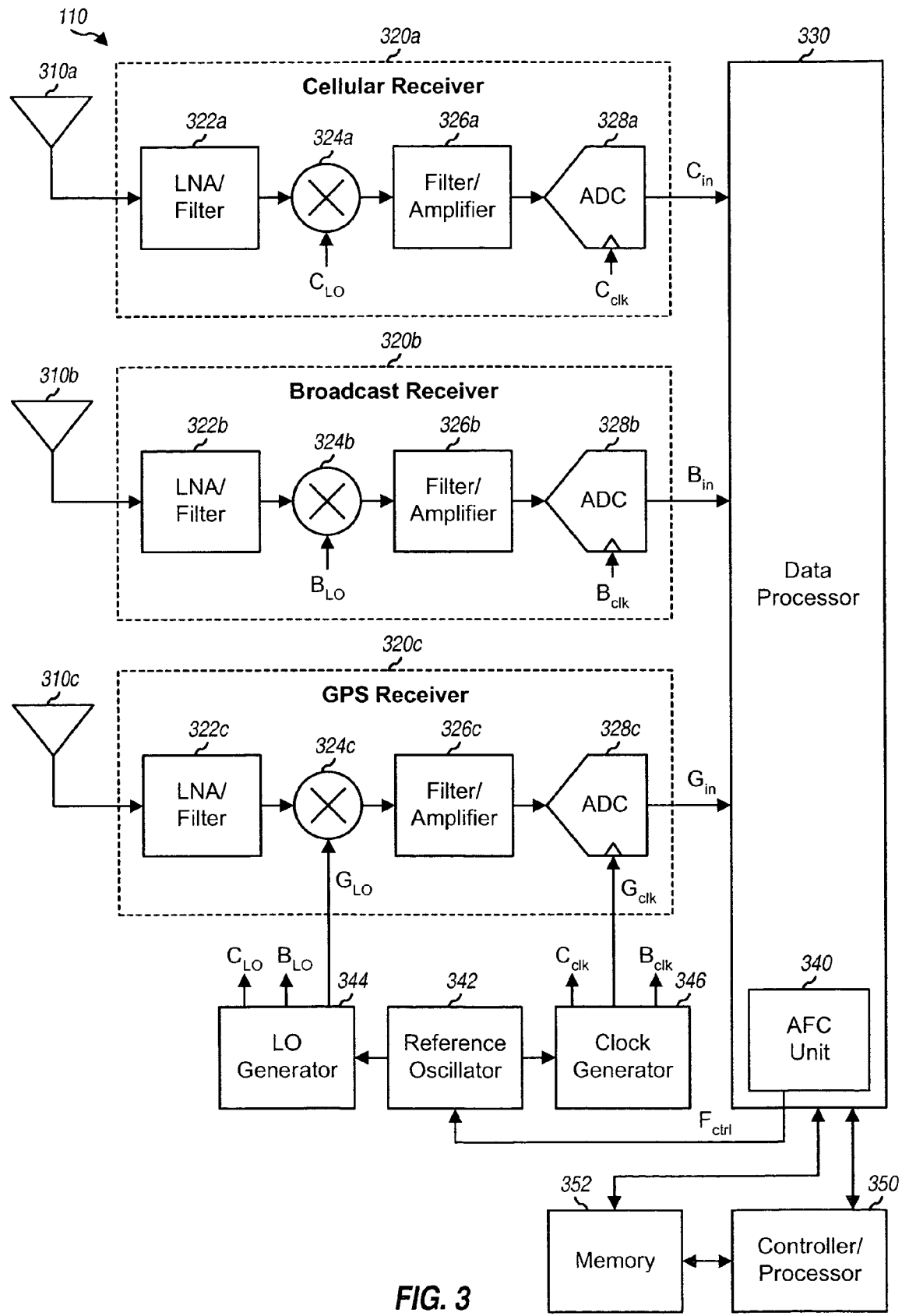
FIG. 3 shows a block diagram of the terminal.

FIG. 3 shows a block diagram of an embodiment of terminal 110. In this embodiment, terminal 110 includes an antenna 310a and a receiver 320a to receive signals from the cellular system, an antenna 310b and a receiver 320b to receive signals from the broadcast system, and an antenna 310c and a receiver 320c to receive signals from GPS satellites. In general, terminal 110 may include any number of antennas and any number of receivers for any number of systems. Multiple systems may share an antenna if the antenna can provide suitable performance for these systems.

Multiple systems may also share a receiver if these systems are not received simultaneously. Multiple antennas and/or multiple receivers may also be used for a given system, e.g., to receive signals in different frequency bands (e.g., cellular and PCS bands).

For the broadcast system, antenna 310b receives signals transmitted by broadcast stations and provides a received RF signal to receiver 320b. Within receiver 320b, a low noise amplifier (LNA) 322b amplifies the received RF signal and provides an amplified RF signal. A filter 322b filters the amplified RF signal to pass signal components in the band of interest and to remove out-of-band noise and undesired signals. A downconverter 324b frequency downconverts the filtered RF signal with an LO signal $B_{LO}$ from an LO generator 344 and provides a downconverted signal. The frequency of the $B_{LO}$ signal is selected such that the signal component in an RF channel of interest is downconverted to baseband or near-baseband. A lowpass filter 326b filters the downconverted signal to pass the signal components in the RF channel of interest and to remove noise and undesired signals. An amplifier 326b amplifies the filtered baseband signal and provides an output baseband signal. An analog-to-digital converter (ADC) 328b digitizes the output baseband signal and provides input samples $B_{in}$ to a data processor 330.

Antenna 310a and receiver 320a similarly receive and process signals transmitted by base stations in the cellular system and provide input samples $C_{in}$ to data processor 330. Antenna 310c and receiver 320c receive and process signals transmitted by GPS satellites and provide input samples $G_{in}$ to data processor 330. Although not shown in FIG. 3 for simplicity, the input samples $B_{in}$, $C_{in}$ and $G_{in}$ may be complex-valued samples having inphase (I) and quadrature (Q) components.

FIG. 3 shows a specific design for receivers 320a, 320b and 320c. In general, a receiver may implement a super-heterodyne architecture or a direct-to-baseband architecture. In the super-heterodyne architecture, the received RF signal is downconverted in multiple stages, e.g., from RF to an intermediate frequency (IF) in one stage, and then from IF to baseband in another stage. In the direct-to-baseband architecture, which is shown in FIG. 3, the received RF signal is downconverted from RF directly to baseband in one stage. The super-heterodyne and direct-to-baseband architectures may use different circuit blocks and different LO frequencies.

In general, a receiver may perform signal conditioning with one or more stages of amplifier, filter, mixer, and so on. A receiver may include different and/or additional circuit blocks not shown in FIG. 3.

Data processor 330 processes the input samples $B_{in}$, $C_{in}$ and $G_{in}$ and provides output data for each system. The processing for each system is dependent on the radio technology used by that system and may include demodulation, decoding, and so on. Data processor 330 is shown as a single processor in FIG. 3 but may comprise one or more application specific integrated circuits (ASICs), digital signal processors (DSPs), processors, and so on.

An AFC unit 340 estimates frequency error of a reference oscillator 342 and generates a frequency control signal $F_{ctrl}$, as described below. Reference oscillator 342 generates a reference signal having a precise frequency $f_{ref}$. Reference oscillator 342 may be a voltage controlled crystal oscillator (VCXO), a temperature compensated crystal oscillator (TCXO), a voltage controlled TCXO (VC-TCXO), a voltage controlled oscillator (VCO), or some other type of oscillator. LO generator 344 receives the reference signal and generates the LO signals for receivers 320a, 320b and 320c. A clock generator 346 also receives the reference signal and generates sampling clocks for ADCs 328a, 328b and 328c. LO generator 344 and clock generator 346 may each be implemented with VCOs, phase locked loops (PLLs), dividers, and so on, as is known in the art.

A controller/processor 350 directs the operation of various units at terminal 110. Controller/processor 350 may determine which system(s) to receive and which channel(s) to receive for each system. A memory 352 stores program codes and data for terminal 110.

In the embodiment shown in FIG. 3, reference oscillator 342 provides the reference frequency $f_{ref}$ that is used to generate the LO signals as well as the sampling clocks for all systems. The use of a single reference oscillator for all systems may reduce cost, power and area and may further simplify operation at terminal 110.

Each transmitter in each system (e.g., each base station, each broadcast station, and each satellite) typically transmits at a precise data rate on a precise RF frequency. The reference oscillator at the terminal is relatively accurate but may have frequency error due to component tolerances, temperature variations, and other factors. Furthermore, frequency error may exist between a given transmitter and the terminal due to Doppler effect caused by movement of the terminal and/or transmitter. Frequency error due to component tolerances and temperature variations typically varies at a slow rate and is common for all systems. Frequency error due to Doppler effect may vary at a faster rate and may be different for different transmitters.

In an aspect, dual-loop AFC is used for frequency control at the terminal. The dual-loop AFC includes (1) an inner loop that corrects short-term frequency variations, e.g., due to Doppler effect, and (2) an outer loop that corrects long-term frequency variations, e.g., due to component tolerances and temperature variations. The dual-loop AFC may be controlled such that good performance is achieved for all systems being received, regardless of which systems are being received.

Figure 4:
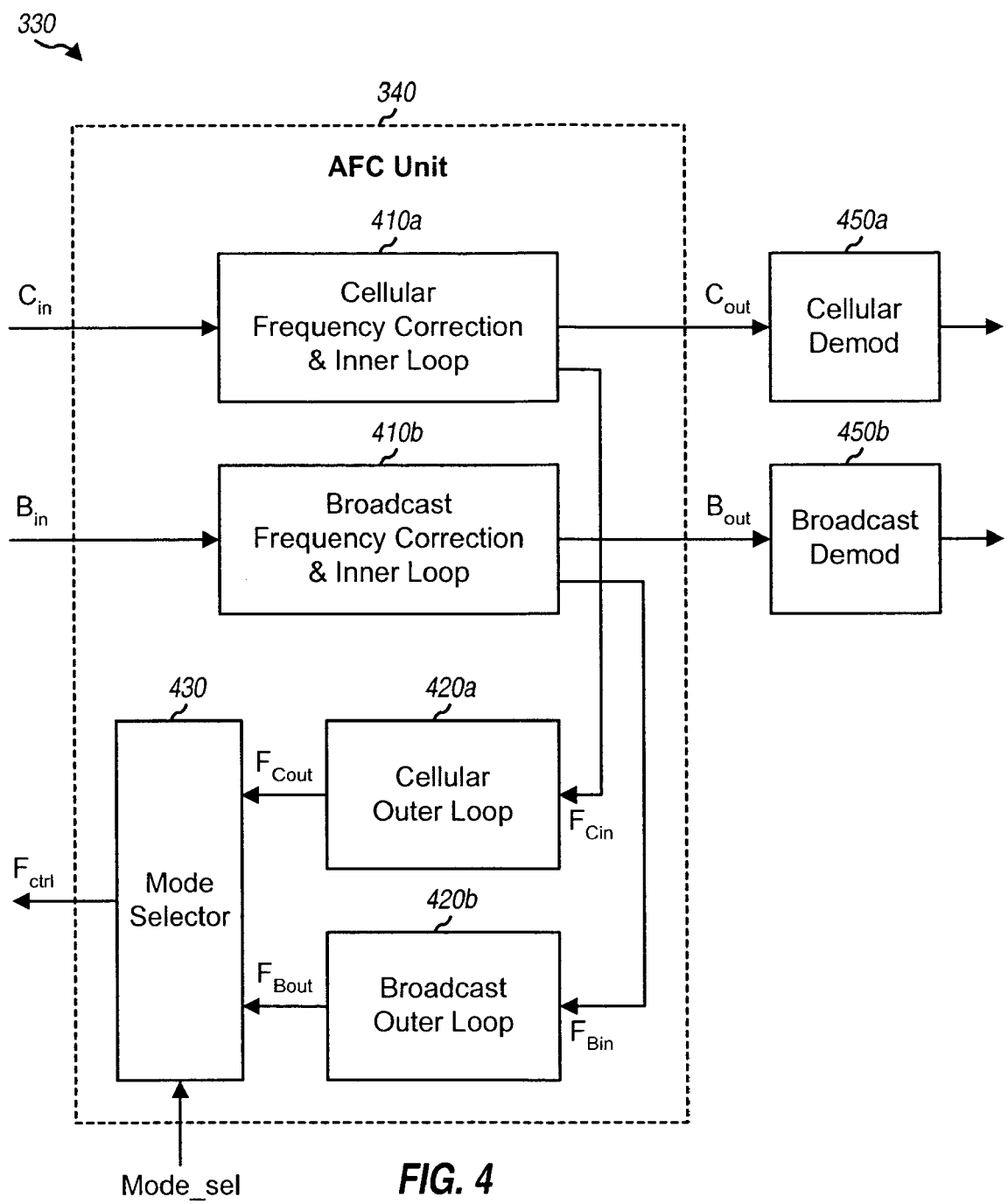
FIG. 4 shows a block diagram of an AFC unit.

FIG. 4 shows a block diagram of an embodiment of AFC unit 340 in FIG. 3. In this embodiment, AFC unit 340 implements an inner loop and an outer loop for the cellular system and an inner loop and an outer loop for the broadcast system. The reference oscillator is driven by either the outer loop for the cellular system or the outer loop for the broadcast system.

Within AFC unit 340, an inner loop unit 410a receives the input samples $C_{in}$ for the cellular system, estimates the short-term frequency error between a base station and the terminal, corrects this frequency error in the input samples $C_{in}$ and provides output samples $C_{out}$ to a cellular demodulator (Demod) 450a, and further provides a short-term frequency error estimate $F_{Cin}$ for the cellular system. Similarly, an inner loop unit 410b receives the input samples $B_{in}$ for the broadcast system, estimates the short-term frequency error between a broadcast station and the terminal, corrects this frequency error in the input samples $B_{in}$ and provides output samples $B_{out}$ to a broadcast demodulator 450b, and further provides a short-term frequency error estimate $F_{Bin}$ for the broadcast system. Units 410a and 410b implement the inner loops for the cellular and broadcast systems, respectively.

An outer loop unit 420a receives the short-term frequency error estimate $F_{Cin}$ for the cellular system, estimates the long-term frequency error for the terminal, and provides a long-term frequency error estimate $F_{Cout}$ to a mode selector 430. Similarly, an outer loop unit 420b receives the short-term frequency error estimate $F_{Bin}$ for the broadcast system, estimates the long-term frequency error for the terminal, and provides a long-term frequency error estimate $F_{Bout}$ to mode selector 430. Selector 430 selects either the $F_{Cout}$ or $F_{Bout}$ frequency error estimate based on a Mode_sel control signal and generates the $F_{ctrl}$ control signal for the reference oscillator. The $F_{ctrl}$ signal may be an analog signal or a digital signal. Selector 430 may perform signal conditioning such as digital-to-analog conversion, level shifting, scaling, and so on. Selector 430 may also generate a pulse width modulated (PWM) control signal.

FIG. 4 shows an embodiment in which two outer loops are maintained for two systems, and the reference oscillator is adjusted based on the outer loop for one system. In another embodiment, a single outer loop is maintained for both systems, and the reference oscillator is adjusted based on this single outer loop. This outer loop may receive the $F_{Bin}$ and $F_{Cin}$ frequency error estimates from the inner loops for the two systems and may generate a single $F_{out}$ based on these frequency error estimates.

Table 1 lists two modes of operation for the terminal. In the cellular and broadcast mode, the terminal concurrently receives the cellular and broadcast systems. In the broadcast-only mode, the terminal receives the broadcast system but not the cellular system. The terminal may also operate in a cellular-only mode (not shown in Table 1) in which the terminal receives the cellular system but not the broadcast system. The terminal may also receive GPS in any operating mode.

Table 1 also lists an embodiment of operating the inner and outer loops for each operating mode. In the cellular and broadcast mode, the inner loops for the cellular and broadcast systems are enabled and track the short-term frequency errors for these systems, and only the outer loop for the cellular system is enabled to control the reference oscillator. In the broadcast-only mode, the inner and outer loops for the cellular system are disabled, the inner and outer loops for the broadcast system are enabled, and the reference oscillator is controlled by the outer loop for the broadcast system.

TABLE 1

|  | Cellular and Broadcast | Broadcast-Only |
| --- | --- | --- |
| Control of reference oscillator | from cellular outer loop | from broadcast outer loop |
| Cellular inner loop | Enabled | Disabled |
| Cellular outer loop | Enabled | Disabled |
| Broadcast inner loop | Enabled | Enabled |
| Broadcast outer loop | Disabled | Enabled |

FIG. 4 and Table 1 show an embodiment in which the reference oscillator is controlled by either the cellular system or the broadcast system. In other embodiments, the reference oscillator may be controlled by different and/or additional systems. For example, if the terminal receives GPS but not cellular or broadcast, then the reference oscillator may be controlled by an AFC unit that operates based on GPS signals. For clarity, the following description is for the embodiment shown in FIG. 4 and Table 1.

The inner and outer loops for the cellular and broadcast systems may be implemented in various manners. An exemplary design for the inner and outer loops for the broadcast system is described below.

Figure 5:
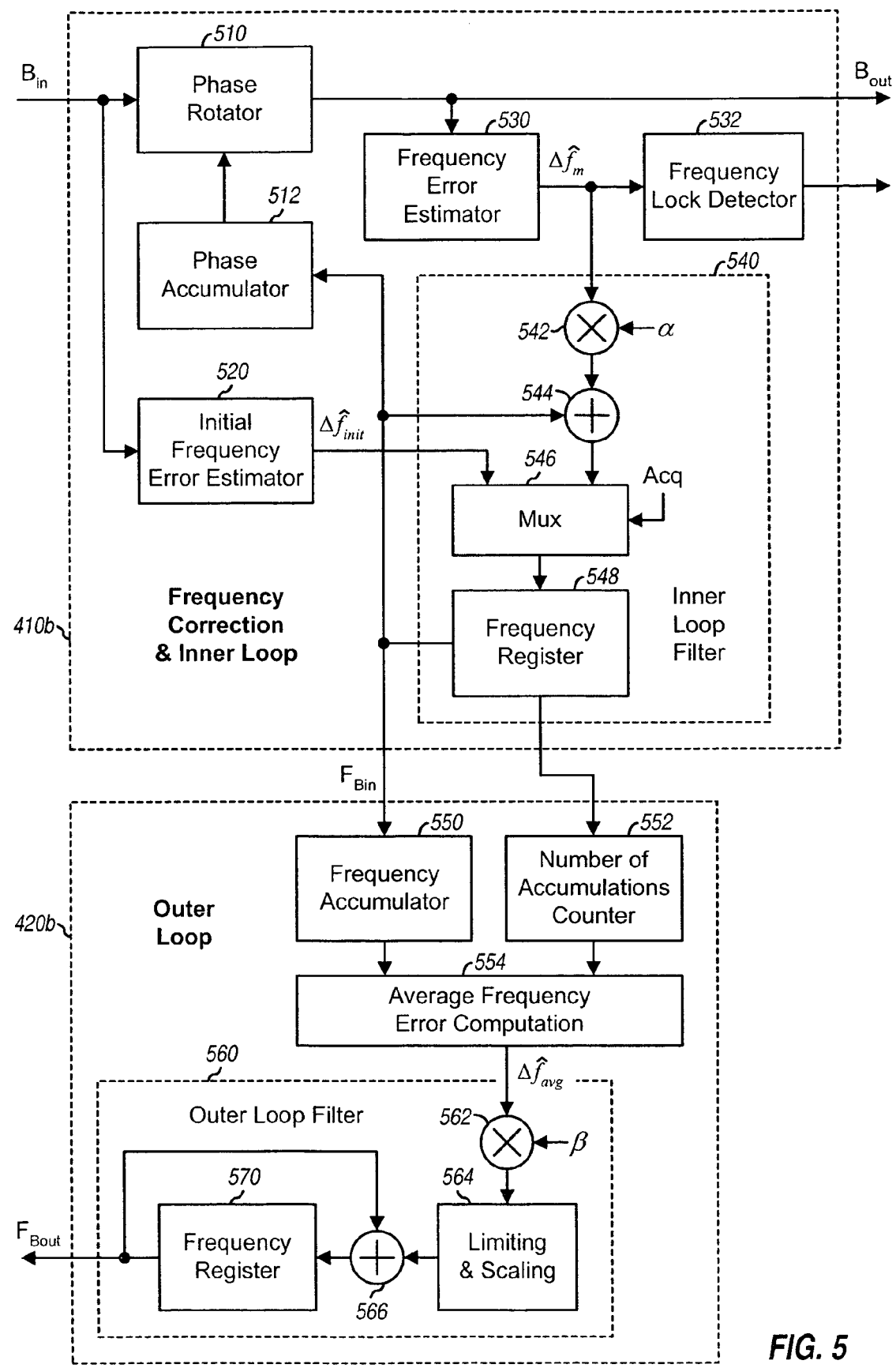
FIG. 5 shows a block diagram of the dual-loop AFC for one system.

FIG. 5 shows a block diagram of an embodiment of inner loop unit 410b and outer loop unit 420b for the broadcast system. Within inner loop unit 410b, the input samples $B_{in}$ are provided to a phase rotator 510 and an initial frequency error estimator 520. Estimator 520 derives an initial frequency error estimate $\Delta\hat{f}_{init}$ (e.g., based on the TDM pilot) whenever directed and provides the initial frequency error estimate to one input of a multiplexer (Mux) 546. Phase rotator 510 rotates each input sample $B_{in}$ by a phase value $\theta_k$ from a phase accumulator 512 and provides a phase-rotated output sample $B_{out}$. The output samples have much of the short-term frequency error removed once frequency lock is achieved for the broadcast system. A frequency error estimator 530 derives frequency error estimates $\Delta\hat{f}_m$, e.g., based on received OFDM symbols. The frequency error estimates are indicative of residual frequency error in the output samples. A frequency lock detector 532 determines whether frequency lock is achieved for the broadcast system.

A loop filter 540 filters the frequency error estimates $\Delta\hat{f}_m$ and provides $F_{Bin}$, which is indicative of the short-term frequency error for the broadcast system. Within loop filter 540, a multiplier 542 multiplies the frequency error estimates $\Delta\hat{f}_m$ with an inner loop gain α. A summer 544 sums the output of multiplier 542 with the output of a frequency register 548. Multiplexer 546 receives the output of summer 544 at another input and provides either the output of summer 544 or the initial frequency error estimate $\Delta\hat{f}_{init}$. Frequency register 548 stores the output of multiplexer 546 and provides the short-term frequency error estimate $F_{Bin}$. Phase accumulator 512 accumulates the short-term frequency error estimate in each sample period and provides the phase correction for each input sample.

Within outer loop unit 420b, a frequency accumulator 550 accumulates the frequency error estimate $F_{Bin}$ from register 548 and provides an accumulated frequency error. A counter 552 counts the number of times that $F_{Bin}$ is accumulated in accumulator 550. A unit 554 divides the accumulated frequency error by the number of accumulations and provides an average frequency error estimate $\Delta\hat{f}_{avg}$. A loop filter 560 filters the average frequency error estimate and provides $F_{Bout}$, which is indicative of the long-term frequency error in the reference frequency. Within loop filter 560, a multiplier 562 multiplies the average frequency error estimate with an outer loop gain β. A unit 564 may limit the output of multiplier 562 to within a particular range to constrain the amount of adjustment to the outer loop in any update period. Unit 564 may also scale the output of multiplier 562. A summer 566 sums the output of unit 564 with the output of a frequency register 570. Frequency register 570 stores the output of summer 566 and provides the long-term frequency error estimate $F_{Bout}$.

The inner and outer loops for the broadcast system may operate as follows. When the terminal first wakes up or first tunes to the broadcast system, estimator 520 derives an initial frequency error estimate $\Delta\hat{f}_{init}$ that captures much of the short-term and long-term frequency error at the terminal. Frequency register 548 stores the initial frequency error estimate. Phase accumulator 512 computes the phase shift in each sample period due to the frequency error from register 548. Phase rotator 510 rotates each input sample by the phase shift from phase accumulator 512. Thereafter, for each received OFDM symbol, estimator 530 derives a frequency error estimate $\Delta\hat{f}_m$ based on the output samples for that OFDM symbol. The frequency error estimate $\Delta\hat{f}_m$ is scaled by the inner loop gain α and accumulated by frequency register 548 via summer 544 and multiplexer 546. Hence, frequency register 548 is initialized with the initial frequency error estimate and is thereafter updated by the frequency error estimate from each received OFDM symbol.

In an embodiment, outer loop 420b is updated in each frame. Frequency accumulator 550, counter 552 and frequency register 570 are reset to zero at the start of each frame. Thereafter, frequency accumulator 550 accumulates the output of frequency register 548 in each OFDM symbol period and up to M times in one frame for the super-frame structure shown in FIG. 2. Counter 552 increments by one each time the output of register 548 is accumulated by accumulator 550. At the end of each frame, unit 554 computes the average frequency error estimate $\Delta\hat{f}_{avg}$, which is then scaled by the outer loop gain $\beta$, limited and/or scaled by unit 564, and accumulated by frequency register 570 via summer 566. Frequency register 570 is updated by a scaled version of the average frequency error estimate in each frame.

In the embodiment described above, phase rotation is performed on each input sample, the inner loop is updated in each OFDM symbol period, and the outer loop is updated in each frame. The inner and outer loops may also be updated at other rates. In general, the inner loop may be updated whenever a frequency error estimate is available, and the outer loop may be updated whenever an average frequency error estimate is available. For example, the outer loop may be updated after receiving a burst of data. The inner and outer loops may also be operated in different modes, e.g., an acquisition mode and a tracking mode, as described below.

The input samples for the broadcast system may be expressed as:

$$x(k) = s(k) \cdot e^{j2\pi \cdot \Delta f \cdot k \cdot T_s + \phi} + n(k), \quad \text{Eq (1)}$$

where s(k) is a sample transmitted in sample period k, x(k) is an input sample for sample period k, n(k) is the noise for input sample x(k), $\Delta f$ is a frequency error, $\phi$ is an arbitrary phase, and $T_s$ is one sample period.

The TDM pilot contains S identical pilot sequences, as shown in FIG. 2. Hence, the transmitted samples are periodic during the TDM pilot, and s(k)=s(k+L). In this case, a correlation on the input samples may be expressed as:

$$x^*(k) \cdot x(k+L) = |s(k)|^2 \cdot e^{j2\pi \cdot \Delta f \cdot L \cdot T_s} + \tilde{n}(k), \quad \text{Eq (2)}$$

where $\tilde{n}(k)$ is the post-processed noise. Equation (2) indicates that the frequency error $\Delta f$ may be isolated by correlating input sample x(k) with delayed input sample x(k+L).

A delayed correlation may be performed for each pilot sequence as follows:

$$C_l = \sum_{i=1}^{L} x_l^*(i) \cdot x_l(i+L), \quad \text{Eq (3)}$$

where $x_l(i) = x(i + l \cdot k_s)$ is the i-th input sample for the l-th pilot sequence,
  $k_s$ is the sample index for the start of the first pilot sequence, and
  $C_l$ is the correlation result for the l-th pilot sequence.

The correlation results for multiple pilot sequences may be accumulated, as follows:

$$C_{init} = \sum_{l=1}^{S'} C_l, \quad \text{Eq (4)}$$

where S' is the number of delayed correlations performed, which is S'<S, and
  $C_{init}$ is the accumulated correlation result for all pilot sequences.

Equation (4) performs coherent accumulation on the S' correlation results and provides $C_{init}$, which is a complex value.

An initial frequency error estimate may then be derived based on the accumulated correlation result, as follows:

$$\Delta\hat{f}_{init} = \frac{1}{G_L} \arctan(C_{init}), \quad \text{Eq (5)}$$

where $G_L$ is a detector gain, which is $G_L = 2\pi \cdot L \cdot T_s$.

The start of the first pilot sequence may be ascertained by performing a sliding correlation on the input samples and detecting for a peak in the sliding correlation. The input samples may be buffered, and the delayed correlation in equation (3) may be performed for all pilot sequences after the TDM pilot has been detected. Alternatively, the TDM pilot may be detected using some of the pilot sequences, and the initial frequency error estimate may be derived using the remaining pilot sequences.

Figure 6:
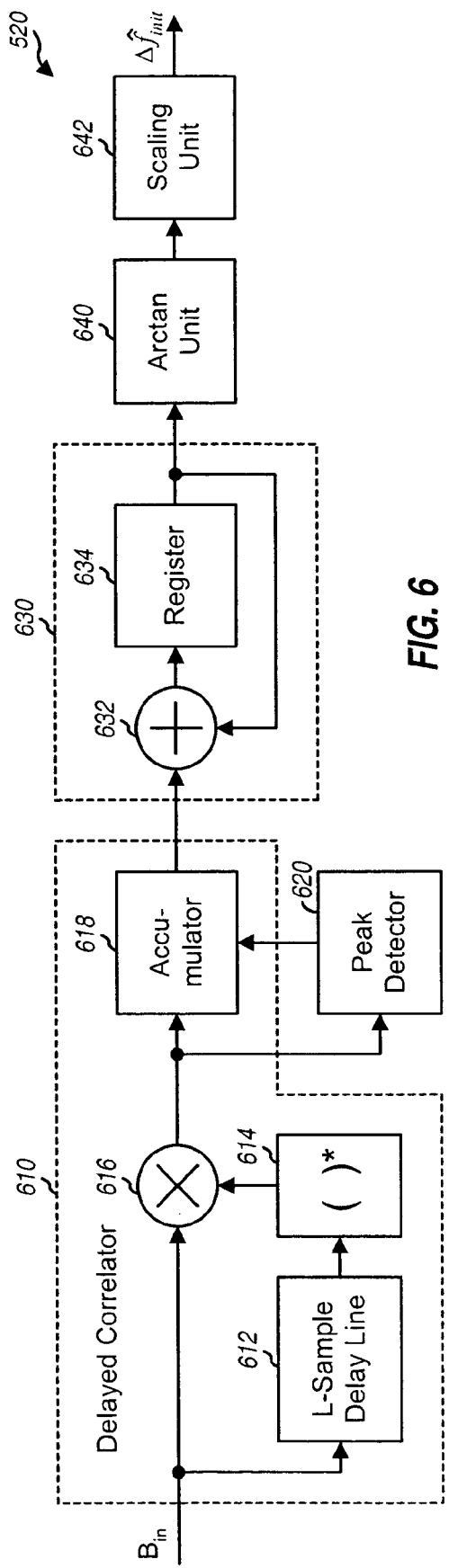
FIG. 6 shows a block diagram of an initial frequency error estimator.

FIG. 6 shows a block diagram of an embodiment of initial frequency error estimator 520 in FIG. 5. In this embodiment, a delayed correlator 610 receives the input samples $B_{in}$ for the broadcast system and performs the delayed correlation shown in equation (4). Within delayed correlator 610, the input samples are provided to an L-sample delay line 612 and a multiplier 616. Delay line 612 delays each input sample by L sample periods, which is the length of the pilot sequence. A unit 614 provides the complex conjugate of each delayed sample from delay line 612. Multiplier 616 multiplies each input sample with the corresponding output from unit 614 and provides the product $x^*_l(i) \cdot x_l(i+L)$ in each sample period. A peak detector 620 detects for the TDM pilot and provides sample index $k_s$ for the start of the first pilot sequence. An accumulator 618 accumulates the output of multiplier 616 over L sample periods for one pilot sequence and provides the correlation result $C_l$ for each pilot sequence.

An accumulator 630, which is formed with a summer 632 and a register 634, accumulates the correlation results from delayed correlator 610 for S' pilot sequences and provides the accumulated result $C_{init}$. An arctan unit 640 computes the arctangent of $C_{init}$. A scaling unit 642 scales the output of arctan unit 640 and provides the initial frequency error estimate $\Delta\hat{f}_{init}$.

Each OFDM symbol contains a cyclic prefix that is identical to the last C samples of the data portion, as shown in FIG. 2. Hence, the samples during the cyclic prefix are periodic, so that s(k)=s(k+K). A frequency error estimate may be computed for each OFDM symbol based on the cyclic prefix, as follows:

$$\Delta\hat{f}_m = \text{Im}\left[\sum_{i=1}^{C'} y_m^*(i) \cdot y_m(i+K)\right], \quad \text{Eq (6)}$$

where $y_m(i)$ is the i-th output sample for the m-th OFDM symbol,
  $\Delta\hat{f}_m$ is a frequency error estimate for the m-th OFDM symbol, and
  C' is the number of samples over which correlation is performed, where C'≦C.

The imaginary part Im [ ] in equation (6) is an approximation of the arctangent in equation (5). This approximation is reasonably accurate when the quantity within the square bracket in equation (6) is small, which is typically the case once frequency lock is achieved.

The start of each OFDM symbol may be determined by a time tracking loop known in the art and not described herein. The accumulation in equation (6) may be performed over all or a subset of the C samples for the cyclic prefix.

Figure 7:
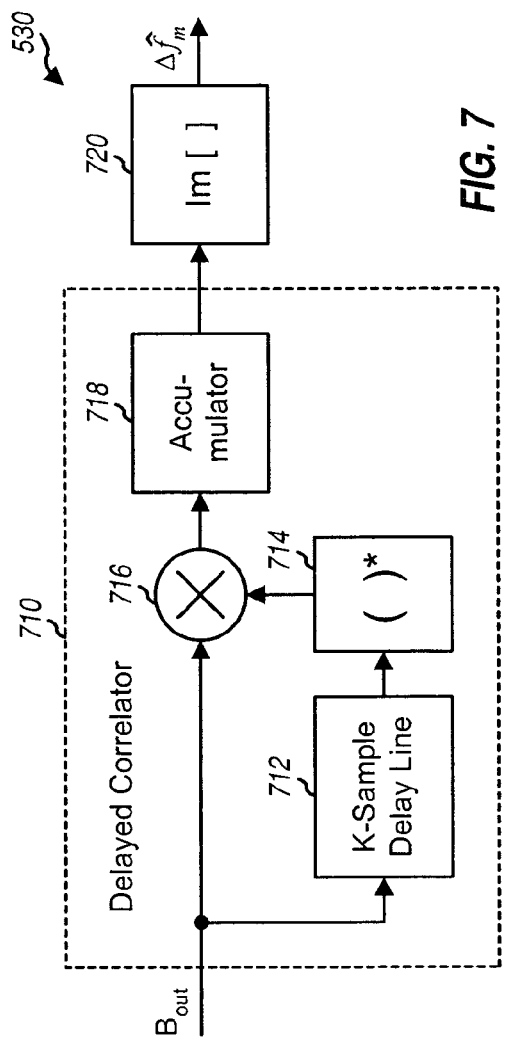
FIG. 7 shows a block diagram of a frequency error estimator.

FIG. 7 shows a block diagram of an embodiment of frequency error estimator 530 in FIG. 5. In this embodiment, a delayed correlator 710 receives the output samples $B_{out}$ for the broadcast system and performs the delayed correlation shown within the square bracket in equation (6). Delayed correlator 710 includes a delay line 712, a complex-conjugate unit 714, a multiplier 716, and an accumulator 718 that operate in similar manner as units 612, 614, 616 and 618, respectively, within delayed correlator 610 in FIG. 6. However, delay line 712 delays each output sample by K sample periods, which is the length of the data portion. Accumulator 718 accumulates the output of multiplier 716 over C' sample periods for the cyclic prefix and provides a correlation result $C_m$ for each OFDM symbol. A unit 720 provides the imaginary part of the correlation result $C_m$ as the frequency error estimate $\Delta \hat{f}_m$.

FIGS. 6 and 7 show exemplary embodiments of frequency error estimators 520 and 530, respectively. The embodiment in FIG. 6 relies on the periodic nature of the TDM pilot to derive the initial frequency error estimate. The embodiment in FIG. 7 relies on the periodic nature of the cyclic prefix in each OFDM symbol to derive a frequency error estimate. In general, frequency error estimation may be performed in various manners depending on the structure of the transmitted signal, the radio technology used for the transmitted signal, and/or other factors.

Referring back to FIG. 5, frequency register 548 provides the current frequency error estimate $F_{Bin} = \Delta \hat{f}$ for the broadcast system. Phase accumulator 512 accumulates this frequency error estimate in each sample period and provides a phase value, which may be given as $\theta_k = -2\pi \cdot k \cdot \Delta \hat{f}$. Phase rotator 510 may rotate each input sample as follows:

$$y_I(k) + jy_Q(k) = [x_I(k) + jx_Q(k)] \cdot [\cos \theta_k + j \sin \theta_k] \quad \text{Eq (7)}$$

where $x(k) = x_I(k) + jx_Q(k)$ is a complex-valued input sample for sample period k, and
$y(k) = y_I(k) + jy_Q(k)$ is a complex-valued output sample for sample period k.

The complex multiplication in equation (7) may be performed with four real multiplications and two real additions.

Frequency lock detector 532 may detect for frequency lock in various manners. In an embodiment, detector 532 initially resets a counter to zero. Thereafter, detector 532 compares each frequency error estimate $\Delta \hat{f}_m$ from estimator 530 against a threshold $\Delta f_{th}$, increments the counter if the frequency error estimate is less than the threshold, and decrements the counter otherwise. Detector 532 declares frequency lock if the counter reaches a maximum value and declares loss of lock if the counter reaches zero. The number of bits for the counter and the threshold $\Delta f_{th}$ may be selected to achieve good lock detection performance. Frequency lock may also be detected in other manners.

In an embodiment, the AFC for the broadcast system may be operated in an acquisition mode or a tracking mode. Both loop modes may be applicable when receiving both cellular and broadcast or when receiving only broadcast. For clarity, the following description is for the case when receiving only broadcast.

In an embodiment, the inner and outer loops are both operational in the acquisition and tracking modes, and different parameter values may be used for the inner and/or outer loop in the two modes. For the inner loop, the same inner loop gain α may be used for both modes. Alternatively, a larger inner loop gain may be used for the acquisition mode, and a smaller inner loop gain may be used for the tracking mode. For the outer loop, a larger outer loop gain β and/or a larger limit may be used in the acquisition mode, and frequency register 570 may be updated by a larger amount in each update interval. In the tracking mode, a smaller outer loop gain β and/or a smaller limit may be used, and frequency register 570 may be updated by a smaller amount in each update interval.

In another embodiment, the outer loop adjusts the reference oscillator to correct short-term and long-term frequency error in the acquisition mode, and the inner and outer loops are both operational in the tracking mode. In the acquisition mode, the inner loop derives frequency error estimates based on the input samples (and not the output samples) and provides these frequency error estimates to the outer loop. The outer loop drives the reference oscillator to the correct frequency. The outer loop may be operated with a larger outer loop gain β and/or a larger limit in the acquisition mode. In this embodiment, the inner loop is essentially non-operational in the acquisition mode, and the outer loop attempts to quickly move the reference oscillator to the correct frequency. In the tracking mode, the outer loop slowly updates the reference oscillator, and the inner loop corrects for short-term frequency error.

The acquisition and tracking modes may also be implemented in other manners. The terminal may support different and/or additional modes. For example, the terminal may also support a hold mode in which the inner and/or outer loops are maintained fixed, e.g., if the received signal quality is poor or if some other conditions are detected.

The terminal may start in the acquisition mode when powered on, after waking up from an extended sleep, when frequency lock is lost, and/or for other conditions. The terminal may transition from the acquisition mode to the tracking mode upon detecting frequency lock, if the adjustment applied to frequency register 570 is below a particular value for some number of updates, and/or if some other conditions are satisfied.

The terminal may periodically receive data from the broadcast system. For example, each frame may carry many OFDM symbols (e.g., approximately 300 OFDM symbols), and the terminal may receive only few OFDM symbols (if any) in each frame. In this case, the terminal may sleep for most of the frame, wake up several OFDM symbols prior to the first OFDM symbol of interest, and process each OFDM symbol of interest. The terminal may update the inner loop in each OFDM symbol period while awake and may update the outer loop prior to going to sleep.

Figure 8:
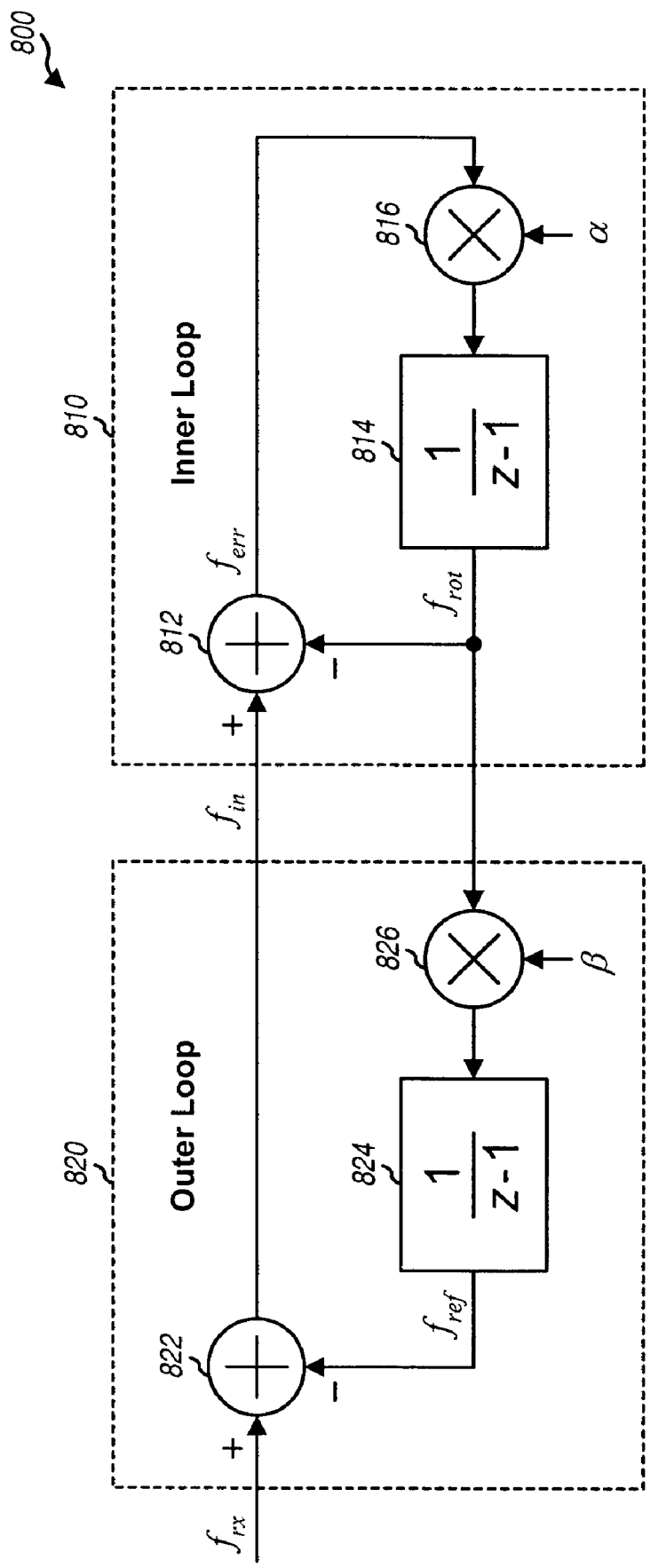
FIG. 8 shows a model of the dual-loop AFC.

FIG. 8 shows a block diagram of a model 800 of the dual-loop AFC for the broadcast system. Model 800 includes a section 810 for the inner loop and a section 820 for the outer loop. Model 800 represents the operation of the inner and outer loops during the tracking mode.

Within outer loop section 820, a summer 822 subtracts the reference frequency $f_{ref}$ from a received frequency $f_{rx}$ and provides an input frequency $f_{in}$. The received frequency is the frequency of a signal received from the broadcast system, the reference frequency is the frequency of the reference oscillator, and the input frequency is the frequency error of the input samples $B_{in}$. Summer 822 models the frequency downconversion by downconverter 324b in FIG. 3.

Within inner loop section 810, a summer 812 subtracts a rotator frequency $f_{rot}$ from the input frequency $f_{in}$ and provides a frequency error $f_{err}$. Summer 812 models the phase rotation by unit 510 in FIG. 5. The rotator frequency $f_{rot}$ is the frequency provided by register 548, and the frequency error $f_{err}$ is the residual frequency error estimated by frequency error estimator 530 in FIG. 5. The frequency error $f_{err}$ is scaled with the inner loop gain α by a multiplier 816 and accumulated by an accumulator 814. Multiplier 816 corresponds to multiplier 532 in FIG. 5, and accumulator 814 corresponds to summer 544 and frequency register 548. Accumulator 814 has a transfer function of $1/(z-1)$ in the z-domain.

In outer loop section 820, the rotator frequency $f_{rot}$ is scaled with the outer loop gain β by a multiplier 826 and accumulated by an accumulator 824 to generate the reference frequency. Multiplier 826 corresponds to multiplier 562 in FIG. 5, and accumulator 824 corresponds to summer 566 and frequency register 570.

A transfer function $H_{in}(z)$ for the inner loop may be expressed as:

$$H_{in}(z) = \frac{f_{rot}}{f_{in}} = \frac{\alpha}{z-1+\alpha}. \qquad \text{Eq (8)}$$

A transfer function $H_{out}(z)$ for the outer loop may be expressed as:

$$H_{out}(z) = \frac{f_{ref}}{f_{rx}} = \frac{\alpha \cdot \beta}{(z-1)^2 + (z-1) \cdot \alpha + \alpha \cdot \beta}. \qquad \text{Eq (9)}$$

Since the sampling rate is typically much higher than the inner and outer loop bandwidths, the z-domain transfer functions in equations (8) and (9) may be converted to s-domain transfer functions using the approximation $z-1=j\omega=s$, where ω is normalized frequency. The s-domain transfer functions may be expressed as:

$$H_{in}(s) = \frac{\alpha}{s+\alpha} \text{ and } H_{out}(s) = \frac{\alpha \cdot \beta}{s^2 + \alpha \cdot s + \alpha \cdot \beta}. \qquad \text{Eq (10)}$$

The bandwidth of the inner loop may be expressed as:

$$BW_{in} = \frac{\alpha}{4} = \frac{\xi \cdot \omega_n}{2}, \qquad \text{Eq (11)}$$

where $\omega_n = \sqrt{\alpha \cdot \beta}$ is a natural frequency of the loop, and $\xi = 0.5\sqrt{\alpha/\beta}$ is a damping factor for the loop.

The bandwidth of the outer loop may be expressed as:

$$BW_{out} = \omega_n \cdot [(1-2\xi^2) + \sqrt{4\xi^4 - 4\xi^2 + 2}]^{1/2}. \qquad \text{Eq (12)}$$

The outer loop bandwidth is typically much more narrow than the inner loop bandwidth in the tracking mode. The inner and outer loop bandwidths may be determined as follows. A desired inner loop bandwidth and a desired ratio of $BW_{in}$ to $BW_{out}$ are initially selected. The damping factor ξ is then determined based on the ratio of $BW_{in}$ to $BW_{out}$ using equations (11) and (12). The natural frequency $\omega_n$ is next determined based on the damping factor ξ and the inner loop bandwidth $BW_{in}$ using equation (11). The inner loop gain α is determined based on the inner loop bandwidth using equation (11). The outer loop gain β is determined based on the inner loop gain α and the natural frequency $\omega_n$. In one exemplary design, $BW_{in}$=128 Hertz (Hz), $BW_{out}$=12.8 Hz, ξ=3.2, $\omega_n$=0.062, α=0.4 and β=0.01. Other designs may also be used for the inner and outer loops. In general, the inner and outer loops may be designed to achieve the desired frequency acquisition and tracking performance for the specified operating scenarios.

For clarity, the inner and outer loops have been described for a specific broadcast system. Other designs may also be used for the inner and outer loops for the broadcast system. The inner and outer loops for the cellular system and/or other systems may be designed in accordance with the structure of the signals transmitted by these systems and the radio technologies used by these systems. For example, frequency error estimates may be derived based on a pilot transmitted by a system. The pilot may be transmitted continuously or periodically, and the inner loop may be updated whenever the pilot is received.

FIG. 9 shows an embodiment of a process 900 for performing frequency control for multiple communication systems. Frequency control for a first communication system is performed with a first inner loop (block 912). Frequency control for a second communication system is performed with a second inner loop (block 914). A reference frequency used to receive the first and second communication systems is adjusted with an outer loop (block 916). The first system may be a broadcast system, and the second system may be a cellular system. The first and second systems may utilize two different radio technologies. For example, the first system may be a broadcast system that utilizes OFDM, and the second system may be a CDMA system. The reference frequency may also be used to receive a satellite positioning system, e.g., GPS. The reference frequency may be used for frequency downconversion, sampling and/or other purposes.

The first inner loop estimates and corrects frequency error in a first input signal for the first system. The second inner loop estimates and corrects frequency error in a second input signal for the second system. The first and second inner loops may be enabled when receiving the first and second systems, respectively.

In an embodiment, first and second outer loops are implemented for the first and second systems, respectively, and are updated with the first and second inner loops, respectively. The first inner loop and the first outer loop may be operational when receiving only the first system. The first and second inner loops and the second outer loop may be operational when receiving the first and second systems. In another embodiment, a single outer loop is implemented for both systems and is updated with the first inner loop or the second inner loop, or both inner loops. In general, the outer loop that is operational estimates the frequency error between the reference frequency and the frequency of the first and/or second system and updates the reference frequency.

FIG. 10 shows an embodiment of an apparatus 1000 for performing frequency control for multiple communication systems. Apparatus 1000 includes means for performing frequency control for a first communication system with a first inner loop (block 1012), means for performing frequency control for a second communication system with a second inner loop (block 1014), and means adjusting a reference frequency, used to receive the first and second communication systems, with an outer loop for (block 916).

Figures 11, 12:
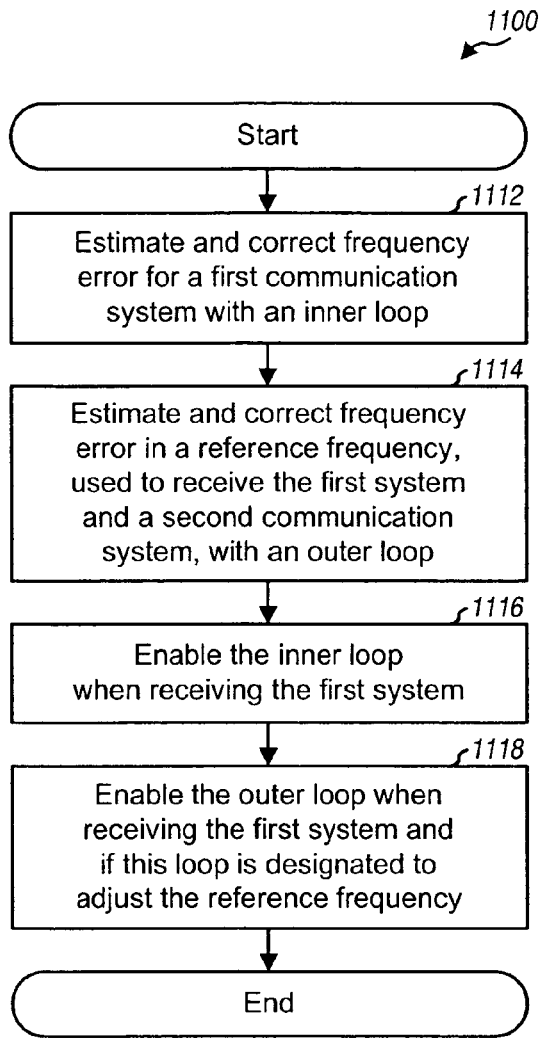
FIG. 11 shows a process to perform frequency control for one system.
FIG. 12 shows an apparatus to perform frequency control for one system.

FIG. 11 shows an embodiment of a process 1100 for performing frequency control for one communication system. Frequency error for a first communication system (e.g., a broadcast system) is estimated and corrected with an inner loop (block 1112). Frequency error in a reference frequency used to receive the first system and a second communication system (e.g., a cellular system) is estimated and corrected with an outer loop (block 1114). The inner loop is enabled when receiving the first system (block 1116). The outer loop is enabled when receiving the first system and if this loop is designated to adjust the reference frequency (block 1118).

The inner loop may comprise a phase rotator, first and second frequency error estimators, a loop filter, a frequency lock detector, or a combination thereof. The phase rotator corrects frequency error in input samples for the first system and provides output samples. The first frequency error estimator derives frequency error estimates indicative of the residual frequency error in the output samples. The first frequency error estimator may derive a frequency error estimate for each received OFDM symbol by correlating the cyclic prefix with the data portion. The second frequency error estimator derives an initial frequency error estimate indicative of the frequency error in the input samples. The second frequency error estimator may derive the initial frequency error estimate by correlating periodic sequences in the signal received from the first system. The inner loop filter may be initialized with the initial frequency error estimate and may thereafter filter the frequency error estimates from the first frequency error estimator to generate an output for the inner loop. The frequency lock detector determines whether frequency lock is achieved for the first system.

The outer loop may comprise first and second modules, a loop filter, or a combination thereof. The first module computes an average frequency error from the inner loop. The second module limits the inputs for the outer loop filter. The outer loop filter filters the average frequency error and provides an output for the outer loop. The outer loop may be operable in an acquisition mode or a tracking mode. In the acquisition mode, the second module may limit the inputs for the outer loop filter to within a first range and/or the outer loop filter may use a first gain value. In the tracking mode, the second module may limit the inputs for the outer loop filter to within a second range that is smaller than the first range and/or the outer loop filter may use a second gain value that is smaller than the first gain value.

FIG. 12 shows an embodiment of an apparatus 1200 for performing frequency control for one communication system. Apparatus 1200 includes means for estimating and correcting frequency error for a first communication system with an inner loop (block 1212), means for estimating and correcting frequency error in a reference frequency with an outer loop (block 1214), means for enabling the inner loop when receiving the first system (block 1216), and means for enabling the outer loop when receiving the first system and if this loop is designated to adjust the reference frequency (block 1218).

Figure 13:
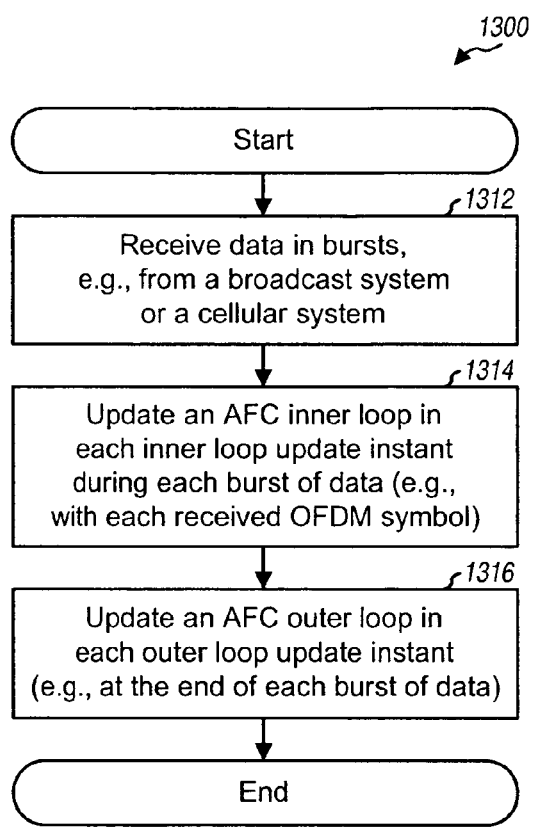
FIG. 13 shows a process to perform frequency control for bursty data.

FIG. 13 shows an embodiment of a process 1300 for performing frequency control for a bursty transmission. A terminal receives data in bursts, e.g., from a broadcast system, a cellular system, or some other system (block 1312). The terminal updates an inner loop for AFC in each inner loop update instant during each burst of data (block 1314). The inner loop estimates and corrects the frequency error in the bursts of data. The terminal updates an outer loop for AFC in each outer loop update instant (block 1316). The outer loop estimates and corrects the frequency error in a reference frequency used to receive the bursts of data. The terminal may receive at least one OFDM symbol in each burst of data and may update the inner loop with each received OFDM symbol. The terminal may update the outer loop at the end of each burst of data, or more or less often. The terminal may wake up prior to each burst of data and may sleep between bursts of data.

Figure 14:
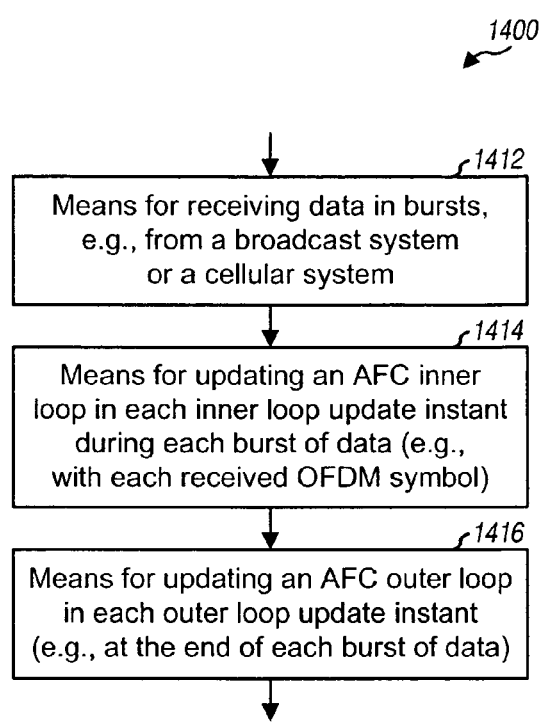
FIG. 14 shows an apparatus to perform frequency control for bursty data.

FIG. 14 shows an embodiment of an apparatus 1400 for performing frequency control for a bursty transmission. Apparatus 1400 includes means for receiving data in bursts (block 1412), means for updating an inner loop for AFC in each inner loop update instant during each burst of data (block 1414), and means for updating an outer loop for AFC in each outer loop update instant (block 1416).

The frequency control techniques described herein may be implemented by various means. For example, these techniques may be implemented in hardware, firmware, software, or a combination thereof. For a hardware implementation, the processing units used for frequency control may be implemented within one or more ASICs, DSPs, digital signal processing devices (DSPDs), programmable logic devices (PLDs), field programmable gate arrays (FPGAs), processors, controllers, micro-controllers, microprocessors, electronic devices, other electronic units designed to perform the functions described herein, or a combination thereof.

For a firmware and/or software implementation, the techniques may be implemented with modules (e.g., procedures, functions, and so on) that perform the functions described herein. The firmware and/or software codes may be stored in a memory (e.g., memory 352 in FIG. 3) and executed by a processor (e.g., processor 350). The memory may be implemented within the processor or external to the processor.

In an embodiment, the inner loop is implemented in hardware, and the outer loop is implemented in software and/or firmware. In other embodiments, the inner and outer loops may be implemented with other combinations of hardware, software, and/or firmware.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

The invention claimed is:

1. An apparatus comprising:
at least one processor configured to perform frequency control for short term frequency variations for a first communication system with a first inner loop, to perform frequency control for short term frequency variations for a second communication system with a second inner loop, and to adjust a reference frequency for long term frequency variations with an outer loop, the reference frequency being used to receive at least one signal from the first and second communication systems,
wherein the at least one processor is configured to implement first and second outer loops for the first and second communication systems, respectively, to update the first and second outer loops with relation to a parameter of the first and second inner loops, respectively, and to select the first or second outer loop as the outer loop that adjusts the reference frequency; and
a memory coupled to the at least one processor.

2. The apparatus of claim 1, wherein the at least one processor is configured to estimate and correct frequency error in a first input signal for the first communication system with the first inner loop, and to estimate and correct frequency error in a second input signal for the second communication system with the second inner loop.

3. The apparatus of claim 1, wherein the at least one processor is configured to estimate and correct frequency error between the reference frequency and a frequency of the first or second communication system with the outer loop.

4. The apparatus of claim 1, wherein the at least one processor is configured to enable the first inner loop and the first outer loop when receiving only the first communication system, and to enable the first and second inner loops and the second outer loop when receiving the first and second communication systems.

5. The apparatus of claim 1, wherein the at least one processor is configured to update the outer loop with the first inner loop or the second inner or both the first and second inner loops.

6. The apparatus of claim 1, wherein the first communication system is a broadcast system and the second communication system is a cellular system.

7. The apparatus of claim 1, wherein the first and second communication systems utilize two different radio technologies.

8. The apparatus of claim 1, wherein the first communication system is a broadcast system utilizing Orthogonal Frequency Division Multiplexing (OFDM), and wherein the second communication system is a Code Division Multiple Access (CDMA) system.

9. The apparatus of claim 1, wherein the reference frequency is used for frequency downconversion of signals received from the first and second communication systems.

10. The apparatus of claim 1, wherein the reference frequency is used for sampling signals for the first and second communication systems.

11. The apparatus of claim 1, wherein the reference frequency is further used to receive a satellite positioning system.

12. The apparatus of claim 1, wherein the short term frequency variations of at least of the first and second communication systems arise from Doppler shifts.

13. The apparatus of claim 12, wherein the long term frequency variations comprise frequency variations due to at least one of the following: component tolerances and temperature variations.

14. The apparatus of claim 1, wherein the long term frequency variations comprise frequency variations due to at least one of the following: component tolerance and temperature variations.

15. The apparatus of claim 1, wherein at least one of the first inner loop and the second inner loop is configured as a scaling operation.

16. A processor configured to:
perform frequency control for short term frequency variations for a first communication system with a first inner loop, to perform frequency control for short term frequency variations for a second communication system with a second inner loop, and to adjust a reference frequency for long term frequency variations with an outer loop, the reference frequency being used to receive at least one signal from the first and second communication systems; and
update the outer loop with relation to a parameter of the first inner loop when the first communication system is selected to adjust the reference frequency, and to update the outer loop with relation to a parameter of the second inner loop when the second communication system is selected to adjust the reference frequency.

17. The processor of claim 16, and further configured to enable the first inner loop when receiving the first communication system, and to enable the second inner loop when receiving the second communication system.

18. The processor of claim 16, wherein the short term frequency variations of at least of the first and second communication systems arise from Doppler shifts.

19. The processor of claim 18, wherein the long term frequency variations comprise frequency variations due to at least one of the following: component tolerances and temperature variations.

20. The processor of claim 13, wherein the long term frequency variations comprise frequency variations due to at least one of the following: component tolerances and temperature variations.

21. The processor of claim 16, wherein at least one of the first inner loop and the second inner loop is configured as a scaling operation.

22. A method comprising:
performing frequency control for short term frequency variations for a first communication system with a first inner loop;
performing frequency control for short term frequency variations for a second communication system with a second inner loop;
adjusting a reference for long term frequency variations with an outer loop, the reference frequency being used to receive at least one signal from the first and second communication systems;
updating the outer loop with relation to a parameter of the first inner loop when the first communication system is selected to adjust the reference frequency; and
updating the outer loop with relation to a parameter of the second inner loop when the second communication system is selected to adjust the reference frequency.

23. The method of claim 22, further comprising:
enabling the first inner loop when receiving a signal of the first communication system; and
enabling the second inner loop when receiving a signal of the second communication system.

24. The method of claim 22, wherein the short term frequency variations of at least one of the first and second communication systems arise from Doppler shifts.

25. The method of claim 24, wherein the long term frequency variations comprise frequency variation due to at least one of the following: component tolerances and temperature variations.

26. The method of claim 22, wherein the long term frequency variations comprise frequency variations due to at least one of the following: component tolerances and temperature variations.

27. The method of claim 22, wherein at least one of the first inner loop and the second inner loop is configured as a scaling operation.

28. An apparatus comprising:
means for performing frequency control for short term frequency variations for a first communication system with a first inner loop;
means for performing frequency control for short term frequency variations for a second communication system with a second inner loop;
means for adjusting a reference frequency for long term frequency variations with an outer loop, the reference frequency being used to receive at least one signal from the first and second communication systems;
means for updating the outer loop with a parameter of the first inner loop when the first communication system is selected to adjust the reference frequency; and
means for updating the outer loop with a parameter of the second inner loop when the second communication system is selected to adjust the reference frequency.

29. The apparatus of claim 28, further comprising:
means for enabling the first inner loop when receiving the first communication system; and means for enabling the second inner loop when receiving the second communication system.

30. The apparatus of claim 28, wherein the short term frequency variations of at least one of the first and second communication systems arise from Doppler shifts.

31. The apparatus of claim 30, wherein the long term frequency variations comprise frequency variations due to at least one of the following: component tolerances and temperature variations.

32. The apparatus of claim 28, wherein the long term frequency variations comprise frequency variations due to at least one of the following: component tolerances and temperature variations.

33. The apparatus of claim 28, wherein at least one of the first inner loop and the second inner loop is configured as a scaling operation.

34. A non-transitory computer-readable medium encoded with a computer program, configured to:
perform frequency control for short term frequency variations for a first communication system with a first inner loop;
perform frequency control for short term frequency variations for a second communication system with a second inner loop;
adjust a reference frequency for long term frequency variations with an outer loop, the reference frequency being used to received at least one signal from the first and second communication systems;
update the outer loop with a parameter of the first inner loop when the first communication system is selected to adjust the reference frequency; and
update the outer loop with a parameter of the second inner loop when the second communication system is selected to adjust the reference frequency.

35. The computer-readable medium of claim 34, further configured to:

enable the first inner loop when receiving the first communication system; and
enable the second inner loop when receiving the second communication system.

36. The computer-readable medium of claim 34, wherein the short term frequency variations of at least one of the first and second communication systems arise from Doppler shifts.

37. The computer-readable medium of claim 36, wherein the long term frequency variations comprise frequency variations due to at least one of the following: component tolerances and temperature variations.

38. The computer-readable medium of claim 34, wherein the long term frequency variations comprise frequency variations due to at least one of the following: component tolerances and temperature variations.

39. The computer-readable medium of claim 34, wherein at least one of the first inner loop and the second inner loop is configured as a scaling operation.

40. A non-transitory computer-readable medium encoded with a computer program, configured to:
estimate and correct frequency error for short term frequency variations for a first communication system with an inner loop;
estimate and correct frequency error in a reference frequency for long term frequency variations with an outer loop, the reference frequency being used to receive at least one signal from the first communication system and a second communication system; and
update the outer loop with a parameter of the inner loop when at least one of the first communication system and the second communication system is selected to adjusted the reference frequency.

* * * * *